United States Patent [19]
Cunningham

[11] Patent Number: 5,559,460
[45] Date of Patent: Sep. 24, 1996

[54] PEAK DETECTION CIRCUIT FOR SUPPRESSING MAGNETORESISTIVE THERMAL ASPERITY TRANSIENTS IN A DATA CHANNEL

[75] Inventor: Earl A. Cunningham, Rochester, Minn.

[73] Assignee: International Business Machines Corporation, Armonk, N.Y.

[21] Appl. No.: 566,756

[22] Filed: Dec. 4, 1995

Related U.S. Application Data

[62] Division of Ser. No. 363,431, Dec. 22, 1994, Pat. No. 5,497,111.

[51] Int. Cl.$^6$ ............................................. H03K 5/02
[52] U.S. Cl. .................................... 327/179; 327/560
[58] Field of Search ........................... 327/179, 178, 327/165, 167, 560, 561, 563, 334

[56] References Cited

U.S. PATENT DOCUMENTS

| | | | |
|---|---|---|---|
| 4,075,671 | 2/1978 | Cheatham et al. | 360/113 |
| 4,141,494 | 2/1979 | Fisher | 235/449 |
| 4,163,909 | 8/1979 | Harr | 307/351 |
| 4,514,703 | 4/1985 | Maher et al. | 330/279 |
| 4,703,284 | 10/1987 | Barbu | 330/259 |
| 4,879,610 | 11/1989 | Jone et al. | 360/67 |
| 4,914,398 | 4/1990 | Jove et al. | 328/167 |
| 4,916,701 | 4/1990 | Eggenberger et al. | 371/37.7 |
| 5,237,464 | 8/1993 | Cronch et al. | 360/36 |
| 5,283,483 | 2/1994 | Laber et al. | 327/65 |
| 5,420,726 | 5/1995 | Mathews et al. | 360/46 |
| 5,448,589 | 9/1995 | McKibben | 330/304 |
| 5,451,949 | 9/1995 | Gundry | 341/143 |

FOREIGN PATENT DOCUMENTS 61-284819  12/1986  Japan .

OTHER PUBLICATIONS

P. W. Chung et al., "Prefiltering in the Design of Peristalic Envelope Detectors", IBM Technical Disclosure Bulletin, vol. 33, No. 10B, Mar. 1991, pp. 48–52.

*Primary Examiner*—Toan Tran
*Attorney, Agent, or Firm*—Terrance A. Meador; Matthew J. Bussan

[57] ABSTRACT

A peak detector for extracting pulses in a magnetoresistive sensor circuit while suppressing the recovery transients created by thermal asperities. The disclosed peak detector circuit is a simplified variation of the standard magnetoresistive sensor peak detector circuit. The signal differentiation is performed ahead of the usual amplification to remove transient pulse amplitudes before they can affect the AGC gain. The resulting differentiated signal is processed by a modified amplitude qualification circuit to extract data output pulses. The thermal asperity transient recovery period is eliminated without additional circuit complexity, leaving only the initial thermal asperity pulse effects to be corrected by any suitable relatively simple error correction code (ECC).

1 Claim, 5 Drawing Sheets

PEAK DETECTION CIRCUIT FOR SUPPRESSING MAGNETORESISTIVE THERMAL ASPERITY TRANSIENTS IN A DATA CHANNEL

This a divisional of application Ser. No. 08/363,431 filed on Dec. 22, 1994 now U.S. Pat. No. 5,497,111.

BACKGROUND OF THE INVENTION

1. Field of the Invention

This invention relates to a method and circuitry for suppressing transient disturbances in a data channel and, more specifically, to a method and circuitry for suppressing transient disturbances arising from collision between a magnetoresistive sensor and aspersed particles adhering to a magnetic disk surface.

2. Description of the Related Art

In a data channel for a magnetoresistive (MR) sensor, a transient disturbance can result from a "thermal asperity". When a hard particle trapped on the surface of a magnetic disk collides with a MR sensor riding closely adjacent to the disk surface, a rapid temperature rise occurs in the sensor. This friction-created temperature increase of up to 120° C. first occurs at the point of contact between particle and MR sensor. The localized temperature increase produces a small but sudden increase in temperature of the entire MR sensor; perhaps as much as several centigrade degrees averaged over the whole sensor, within 50 to 100 nanoseconds. Became the MR sensor has a non-zero temperature coefficient of resistance (e.g. 0.003/C° for permalloy), the sensor resistance then increases in response to the sudden temperature rise.

The heat conducted into the MR sensor from the localized hot spot diffuses slowly from the sensor to the local environment, causing the typical delayed exponential decay known for such thermal asperities. For instance, the increased sensor resistance can be seen to decline about 30% within the first one-half to five microseconds following collision.

Because the MR sensor detects magnetic signals by exploiting the magnetoresistive effect, resistance changes arising from magnetic changes on the disk surface adjacent to the sensor are detected as changes in voltage across the sensor. A DC bias current induces the voltage across the sensor resistance that varies according to changes in the sensor resistance. Thus, a thermal asperity induces a superimposed voltage transient on the desired data signal from the sensor. Because MR sensor non-linearity increases with increasing magnetic signal excursions about the sensor bias point, the sensor is designed to keep the magnetic excursions induced by desired data signals sufficiently small to ensure reasonable sensor linearity. For instance, detection of a magnetic change on the disk surface may require only a 0.3 percent change in sensor resistance. Thus, thermal asperity transients can exceed 400 percent of the typical base-to-peak magnetic data signal voltage amplitude from the MR sensor.

The high amplitude and long decay time of a thermal asperity transient severely disrupts the data stream from a MR sensor, perhaps masking 5 to 30 bytes of contiguous data pulses. Such a long series of errors is very difficult to correct using normal error correction codes. If a sensor pulse detection circuit uses automatic gain control (AGC), thermal asperity transients can disrupt even longer sequences of data because of increases in transient decay time arising from AGC settling time effects.

Practitioners in the art have proposed two fundamental types of solutions to the thermal asperity transient problem: improved error correction codes and voltage transient cancellation schemes. Both types of solutions tend to be complex and expensive to implement.

In U.S. Pat. No. 4,914,398, Steven A. Jove et al disclose a method and circuitry for cancelling thermal asperity transients in a magnetoresistive sensor channel by pulling the voltage transient quickly back to zero. Their solution is useful but requires significant additional circuitry and leaves imperfections in the signal waveforms such as increased additive correlated noise and spurious pulses.

P. W. Chung et al ("Pre-filtering In The Design of Peristaltic Envelope Detectors", IBM Technical Disclosure Bulletin, Vol. 33, No. 10B, pp. 48–52, March 1991) propose a switched pre-filter that modifies the MR sensor detection circuit frequency response to remove elements of the thermal asperity transient signal. Their front-end pre-filter distorts tile desired data signal but may remove noise that cannot be properly cancelled with a transient cancellation scheme such as taught by Jove et al above. Thus, the Chung et al solution is ultimately even more expensive and complex than that suggested by Jove et al.

In U.S. Pat. No. 4,916,701, John S. Eggenberger et al disclose a method for correcting multi-byte errors in a data channel coupled to a magnetic medium on which data is recorded in variable length blocks. The blocks must include error correction code (ECC) for which ECC "syndromes" are generated during reading. While their method is very useful for correcting long error bursts, it is expensive in terms of data storage space and error correction processing resources and is incompatible with many data formats. In combination with thermal asperity transient cancellation methods known in the art, the Eggenberger et al ECC method offers a useful means for correcting errors created by thermal asperity transients. However, the resulting combination of methods is complex and expensive, requiring substantial additional components, data storage and data processing resources.

There is a clearly felt need in the art for a simpler and more efficient method for overcoming data errors in a MR sensor channel arising from thermal asperity transients. This unresolved problem is solved by this invention in the manner described below.

SUMMARY OF THE INVENTION

This invention is a modified peak detection circuit that reverses the signal conditioning sequence normally used in MR sensor peak detector circuits. The method of this invention performs the signal differentiation in a first signal processing stage before or concurrently with the Automatic Gain Control (AGC) function. Finally, a modified "pulse qualification" operation is performed on the differentiated signal waveform instead of the original gain-controlled and filtered sensor output waveform.

With this invention, the effects of thermal asperity transient decay are virtually eliminated before pulse detection, leaving only the effects of the brief initial thermal increase. This advantageous result is accomplished by reversing the signal processing sequence normally used for peak detection and by using a pulse amplitude qualification circuit modified to eliminate spurious pulses in their differentiated form. Basic circuit operation and complexity is similar to the simplest peak detection circuits known in the art. Sophisticated thermal asperity transient cancellation functions and ECC schemes are not necessary with the circuit of this invention. Simple ECC methods are normally sufficient to handle data loss during the initial 100 nanosecond collision pulse effects that are not removed by this invention.

It is an object of the circuit of this invention to remove the effects of thermal asperity voltage transients without adding sophisticated error cancellation and correction circuitry. It is an unexpected and beneficial advantage of this invention that substantially all thermal asperity transient decay effects are removed by simply reversing the order of signal gain and signal differentiation commonly used in MR sensor peak detector circuits and by adding a special pulse amplitude qualification circuit.

The foregoing, together with other objects, features and advantages of this invention, will become more apparent when referring to the following specification, claims and the accompanying drawing.

BRIEF DESCRIPTION OF THE PREFERRED EMBODIMENTS

For a more complete understanding of this invention, reference is now made to the following detailed description of the embodiments illustrated in the accompanying drawing, wherein.

DETAILED DESCRIPTION OF THE PREFERRED EMBODIMENTS

Existing MR Sensor Peak Detection Circuits

Figure 1:
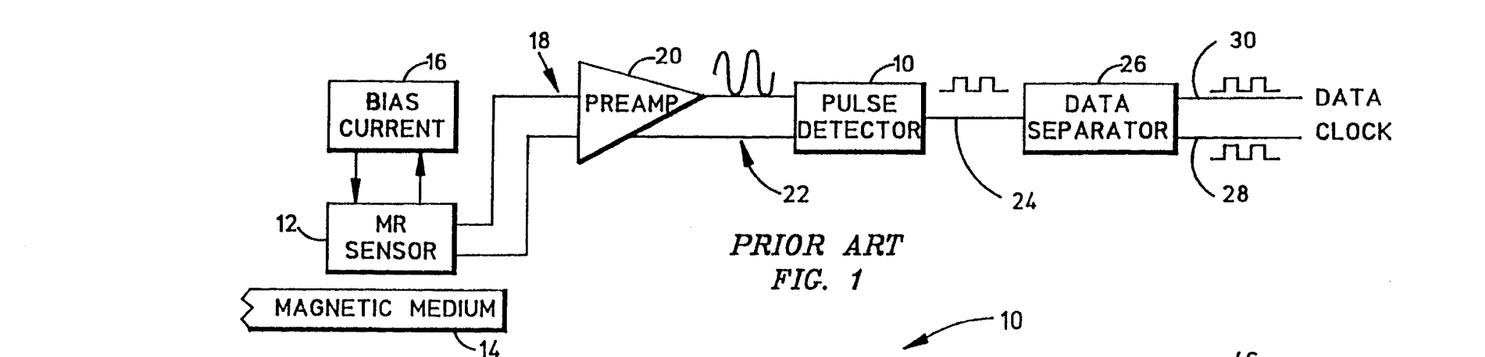
FIG. 1 is a block diagram representation of an illustrative embodiment of a MR sensor signal processing circuit from the prior art.

FIG. 1 shows a portion of a magnetoresistive (MR) sensor signal processing circuit that includes a pulse detector 10. In operation, the MR sensor 12 rides in close proximity to a rotating magnetic medium 14. Magnetic medium 14 contains data in the form of localized changes in magnetic polarization. When these locally polarized areas move next to MR sensor 12, the sensor resistance changes slightly because of the magnetoresistive effect known in the art.

The small changes in MR sensor resistance are detected using a constant-current biasing source 16. Biasing source 16 forces a predetermined current through MR sensor 12. Thus, any changes in MR sensor resistance will be directly represented as changes in voltage drop across MR sensor 12. These voltage changes compose a signal 18 that is then coupled to a preamplifier 20, which isolates MR sensor 12 from the remaining signal processing circuitry. Other suitable bias methods known in the art may also be employed to generate signal 18 responsive to MR sensor resistance changes.

The input signal 22 to pulse detector 10 is an analog voltage signal from the output of preamplifier 20 that contains the data pulse information from magnetic medium 14. The purpose of pulse detector 10 is to accurately extract the asynchronous steam of data output pulses 24 from input signal 22. Data output pulses 24 are coupled to a data separator 26, which extracts a digital clock signal 28 and a digital data signal 30 in any suitable manner known in the art.

Figure 2:
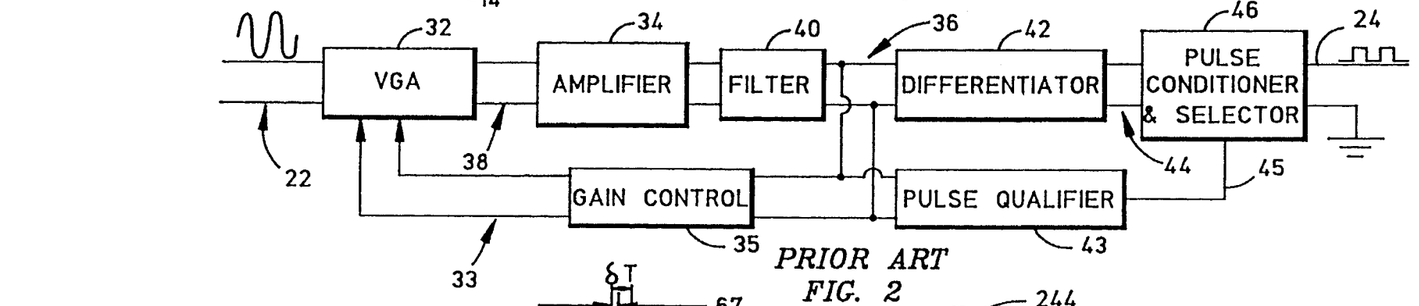
FIG. 2 is a block diagram representation of an illustrative embodiment of the pulse detector from FIG. 1.

FIG. 2 shows one typical embodiment of pulse detector 10 known in the art. The automatic gain control (AGC) function is positioned first and consists of variable gain amplifier (VGA) 32, amplifier 34, gain control circuit 35 and filter 40. This immediately stabilizes the amplitude of input signal 22 in the form of a stabilized, amplified and filtered signal 36. The AGC function automatically adjusts for slow variations in the amplitude of input signal 22 caused by such things as changes in spacing between MR sensor 12 and magnetic medium 14, drift in bias current from biasing source 16, drift in the gain of preamp 20, and the like. Unfortunately, thermal asperity transients, such as those shown in FIGS. 3A and 4A, often have decay components of duration sufficient to force gain control circuit 35 to change the gain in VGA 32 in an undesired attempt to stabilize the amplitude of signal 36.

Figure 3A:
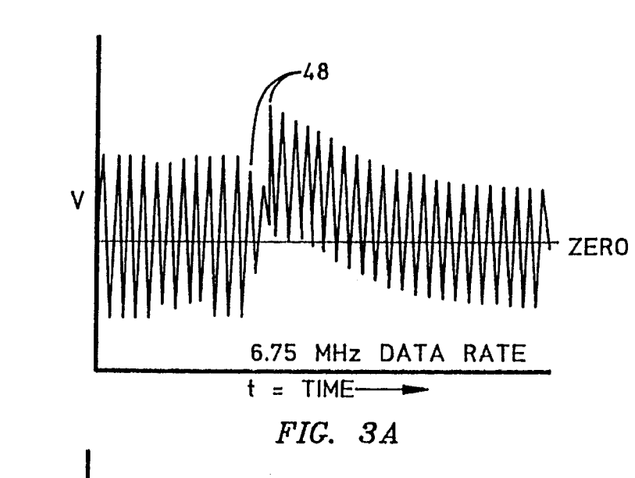
FIGS. 3A and 3B depict a 6.75 MHz MR sensor output signal voltage with superimposed thermal asperity transient disturbance in a data channel before and after differentiation.
Figure 4A:
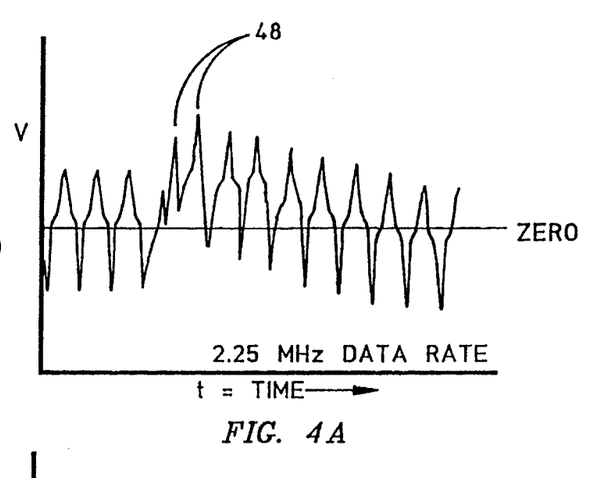
FIGS. 4A and 4B depict a 2.25 MHz MR sensor output signal voltage with superimposed thermal asperity transient disturbance in a data channel before and after differentiation.

Any circuit function that depends on signal amplitude is overwhelmed and disabled when the waveform amplitude suddenly increases by more than 100% of the expected peak signal amplitude. Normal gain control circuit 35 operation compares the amplitude of stabilized signal 36 to predetermined references. Thus, slow thermal asperity transients such as those shown in FIGS. 3A and 4A are each immediately interpreted by circuit 35 as a large increase in signal amplitude, forcing a reduction in VGA 32 gain. Once the thermal asperity transient has passed, circuit 35 then brings the gain of VGA 32 slowly back to normal. The gain control circuit 35 designs known in the art reduce gain much more rapidly than they increase gain. This forces the VGA output signal 38 down to a low amplitude for an extended time following each thermal asperity transient. Such a low amplitude increases the probability of pulse detection errors in later circuit stages.

Another problem is presented by possible clipping at the output of amplifier 34, the design of which does not normally allow amplitude increases of 200 percent or more without clipping. Such clipping can delete important data pulse information from VGA output signal 38 during the time before VGA 32 gain is again reduced. Redesigning VGA 32 and amplifier 34 for a larger output dynamic range by using a small nominal signal operating amplitude is not a suitable solution because this increases overall sensitivity to stray digital interference.

Typically, VGA output signal 38 amplified by amplifier 34 is coupled to a filter 40, which produces the amplified filtered stabilized signal 36. Signal 36 is only then differentiated by a differentiator circuit 42 and thresholded by a pulse qualifier circuit 43 to produce differentiated signal 44 and a selection control signal 45. Signal 44 is coupled to a pulse conditioner and selector circuit 46, which provides the edge detection and pulse conditioning necessary to produce data output pulses 24 according to predetermined pulse specifications. Differentiated signal 44 represents the instantaneous time rate of change of signal 36.

In many peak detection circuits known in the art, pulse qualifier circuit 43 uses a simple threshold circuit to distinguish actual data pulses from spurious bumps in signal 36. Other similar well-known schemes may also be used to "qualify" pulses detected in circuit 46 for "selection" as valid pulses. In normal operation, control signal 45 causes circuit 46 to remove "non-qualified" pulses from the data output pulse stream 24. When a thermal asperity transient is introduced, the typical simple threshold implementation of pulse qualifier circuit 43 is effectively disabled because all pulses are lost in the transient. Accordingly, the typical embodiment of pulse detector 10 shown in FIG. 2 has little tolerance for thermal asperity transients of the type shown in FIGS. 3A and 4A.

Figure 5:
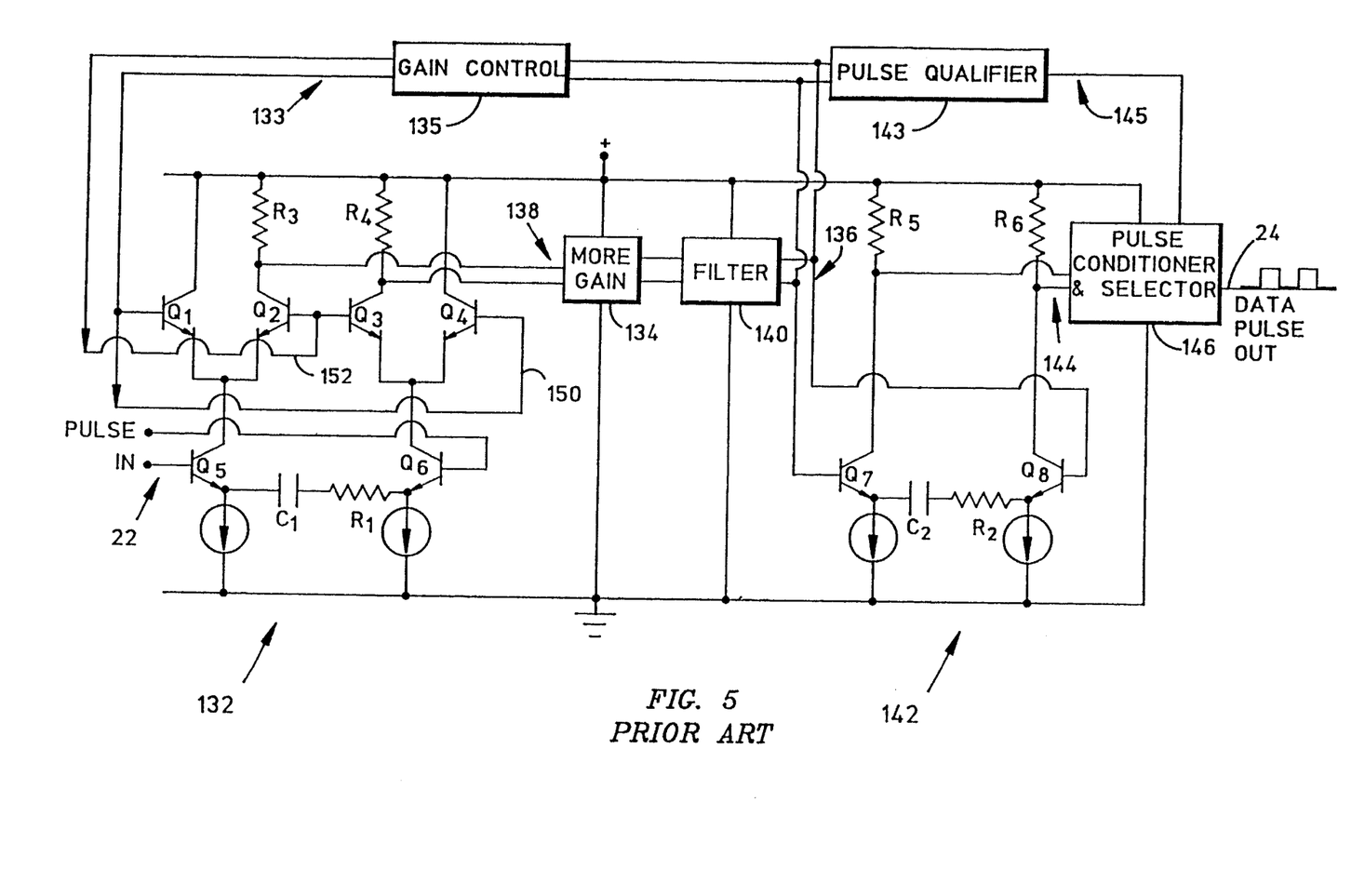
FIG. 5 is an illustrative embodiment of a pulse detector circuit from the prior art.
Figures 6, 8:
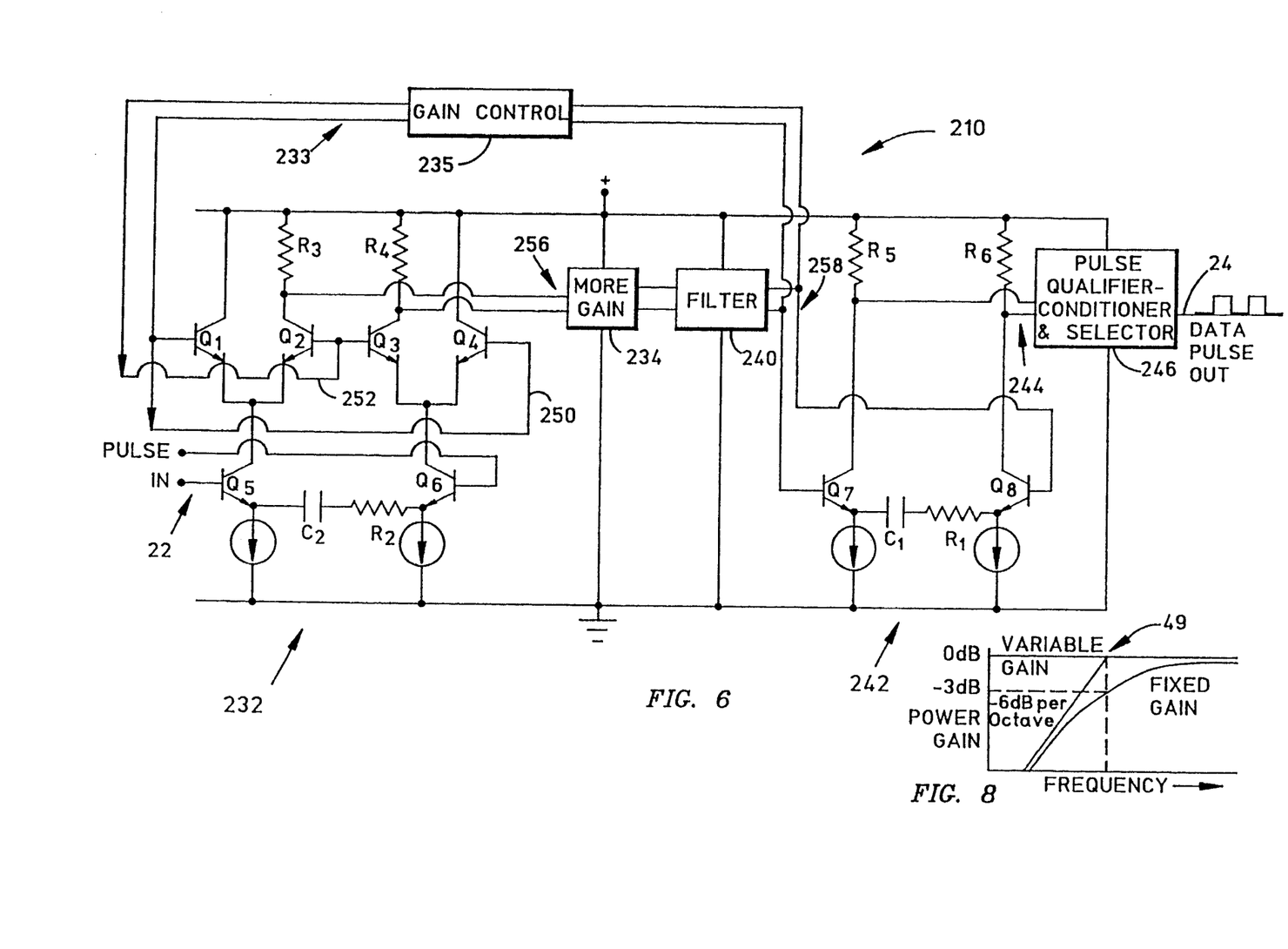
FIG. 6 is an illustrative embodiment of the pulse detector circuit of this invention.
FIG. 8 shows the half-power (−3 dB) break frequency of a typical amplifier gain curve from the prior art.

FIG. 5 shows the prior art pulse detector 10 from FIG. 2 with more circuit details for VGA circuit 132 and differentiator circuit 142. Amplifier 134, filter 140 and pulse conditioner and selector circuit 146 are shown in functional block form. In existing practice, VGA circuit 132 and differentiator circuit 142 are often configured as shown in FIG. 5. Circuit 132 is shown with differential transistor pair Q5 and Q6 at input 22. FIG. 8 shows the lower end of a typical frequency response curve for this amplifier, which is dominated by capacitor C1 and resistor R1 in series. At high frequencies, above the half-power (−3 dB) gain frequency 49 at which nominal amplifier operating-frequency power gain is reduced by half, capacitor C1 has a low impedance and resistor R1 alone determines the impedance between the emitters of transistors Q5 and Q6. Because transistors Q5 and Q6 are emitter-coupled by a fixed impedance above the half-power gain frequency 49, the differential amplifier gain is independent of frequency and produces a VGA output signal waveform 138 that appears identical to the input signal waveform at line 22.

Below the half-power (−3 bB) gain frequency 49 shown in FIG. 8, the C1 impedance magnitude is higher than that of resistor R1, dominating the emitter coupling impedance, which thus decreases with increasing frequency in this region. The gain of differential pair Q5 and Q6 accordingly increases directly with increasing frequency, which forces the differential amplifier Q5 and Q6 to act as a differentiator in this frequency region, giving an output signal representative of the time rate of change of input signal 22. In existing practice, capacitor C1 and resistor R1 are selected to place the half-power (−3 dB) gain frequency 49 at about 50 kHz, forcing the differentiating band below 50 kHz. At normal data pulse frequencies, which are well above 50 kHz, transistors Q5 and Q6 then operate as a simple fixed-gain amplifier.

The variable-gain (VGA) function of circuitry 132 is provided by two other differential amplifiers in the collector circuits of transistors Q5 and Q6. These are formed by the transistor pair Q1 and Q2 and the transistor pair Q3 and Q4, respectively. The first of these two differential amplifiers is disposed in the collector circuit of transistor Q5 and the other is disposed in the collector circuit of transistor Q6. The feedback voltage difference 133 between the lines 150 and 152 is derived for VGA operation from gain control circuit 135 by comparing filtered signal 136 to a fixed reference (not shown).

Different currents flow in each transistor of transistor pairs Q1 & Q2 and Q3 & Q4 according to the polarity and magnitude of the feedback voltage difference 133 between lines 150 and 152. When the voltage on line 152 is a few hundred millivolts higher than the voltage on line 150, most of the collector current in transistors Q5 and Q6 flows through load resistors R3 (transistor Q2) and R4 (transistor Q3), forcing the gain of transistor pair Q5 and Q6 to the maximum value. When the voltage on line 150 is a few hundred millivolts higher than the voltage on line 152, most of the signal current flows through transistors Q1 and Q4, bypassing resistors R3 (transistor Q2) and R4 (transistor Q3), and forcing the gain of transistor pair Q5 and Q6 to nearly zero.

The transistor pair Q7 and Q8 in differentiator circuit 142 operates in the same manner as does transistor pair Q5 and Q6 in VGA circuit 132. Differential pairs analogous to pair Q1 and Q2 and pair Q3 and Q4 of circuit 132 are not provided in circuit 142 because no gain control feedback is necessary.

The operation of circuit 142 in existing practice is as previously described for circuit 132 except that capacitor C2 and resistor R2 are selected so that if-power (−3 dB) gain frequency 49 (FIG. 8) is placed much higher, typically far above the data pulse repetition rate, such as at 30 MHz. When the half-power gain frequency of circuit 142 is placed at 30 MHz, the amplifier gain of circuit 142 increases directly with frequency over the entire data pulse rate frequency band, which is substantially below 30 MHz. Thus, circuit 142 operates as a differentiator to extract the time rate of change of signal 136. Differential signal 144 out of differentiator circuit 142 is an analog signal that is then used by pulse conditioning circuit 146 to produce the stream of data output pulses 24. In one sense, differential signal 144 is "half digital" because the signal amplitudes are stabilized at fixed values and the zero-crossing times represent analog information. The data pulse stream is subsequently fully digitized at data separator circuit 26 (FIG. 1), which extracts data pulses synchronized to a recovered clock signal in any useful manner.

The Invention

Figure 3B:
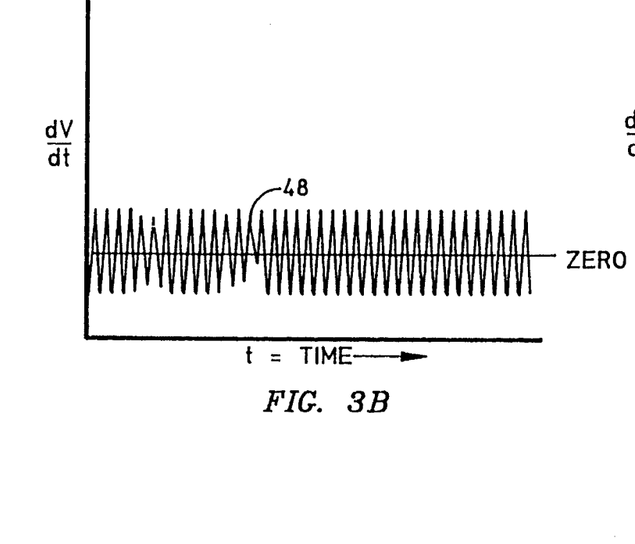
Figure 4B:
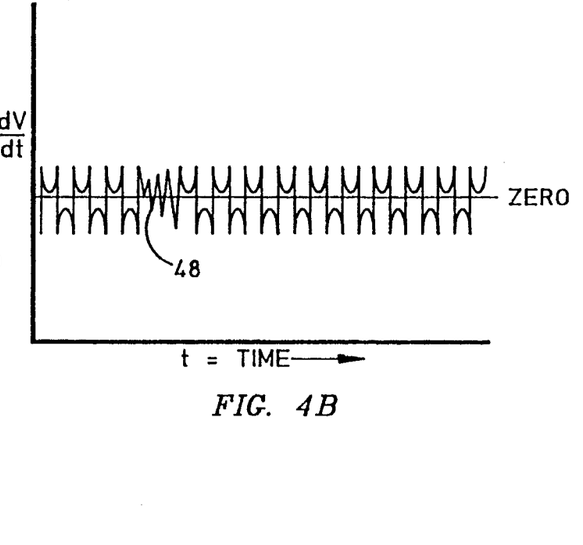

This invention resulted from the wholly unexpected and advantageous observation that the recovery components from thermal asperity transients, exemplified by transients 48 shown in FIGS. 3 and 4, are almost completely absent from the time rate of change of input signal 22. This can be appreciated by examining FIGS. 3B and 4B, which show the differentiated version of the signals illustrated in FIGS. 3A and 4A, respectively. Note that the initial thermal asperity transients 48 leave disturbances in FIGS. 3B and 4B but that these disturbances do not significantly affect the differential signal waveform immediately following the first brief disturbance. Accordingly, a simple error correction code (ECC) should be sufficient to overcome the brief disturbances shown at 48 in FIGS. 3B and 4B.

Much of the circuitry discussed above in connection with FIG. 5 is also shown in FIG. 6, which shows the pulse detector 210 of this invention. The modified pulse detection circuit 210 of this invention performs the differentiation function ahead of the amplification function where the signal level is still small, creating differentiated signal 256. This avoids the overload and saturation effects discussed above. The AGC function performed by circuits 234, 235 and 240 is applied to the differentiator 232 instead of amplifier 242. The differentiator 232 has a lower half-power gain roll-off frequency greater than 300% of the data rate and the amplifier 242 has a lower half-power gain roll-off frequency less than 3% of the data rate. The resulting stabilized, amplified and filtered waveform 258 is coupled to a zero-crossing detector in circuit 246 (e.g., FIG. 9) that develops a square pulse edge corresponding to each pulse peak in the original input waveform 22 in any useful manner known in the art. This modified pulse detector 210 uses a modified pulse qualification circuit 246 to eliminate spurious peaks by testing the differentiated signal rather than the original input signal, as discussed below in connection with FIG. 9. Pulse detector circuit 210 of this invention virtually eliminates the large transient recovery time interval without substantially changing the number or complexity of circuit components and functions.

In FIG. 6, capacitor C1 and resistor R1 from FIG. 5 are exchanged with capacitor C2 and resistor R2 from FIG. 5 to create the preferred embodiment of this invention. This component exchange places the half-power gain frequency 49 (FIG. 8) of circuit 232 at, for instance, 30 MHz (300% of the 10 MHz data rate) instead of, for instance, 50 kHz, thereby converting circuit 232 from a variable-gain amplifier (VGA) with constant gain over the data signal band to a variable gain differentiator (VGD) with linearly frequency-dependent gain for all data pulse rates below 10 MHz or so. Similarly, changing the half-power gain frequency 49 of circuit 242 from 30 MHz to 50 kHz (or even 30 kHz, which is 0.3% of the 10 MHz data rate) converts circuit 242 from a differentiator circuit with frequency-dependent gain over the data signal band to a simple constant-gain amplifier for signal frequencies above 150 kHz or so. This can be appreciated by considering the upper portion of the gain vs. frequency curve shown in FIG. 8. Input signal 22 is relatively small and the gain of VGD 232 is very low at the lowest data signal frequencies (where most thermal asperity transient energy exists) because C2 and R2 are chosen to put the half-power gain point at the high frequency needed to obtain the desired differentiating effect. Thus, thermal asperity transients cannot force any of transistors Q1–Q6 into saturation or otherwise exceed their normal input operating voltage range.

FIGS. 3B and 4B provide two typical waveforms for the differential signal 256 of FIG. 6 for C2 and R2 values selected according to this invention. Signal 256 is further amplified by amplifier 234 and filtered by filter 240 to obtain signal 258. The AGC function provided by circuits 234, 235 and 240 stabilizes the magnitude of filtered differentiated signal 258. Selection of feedback component values in gain control circuit 235, in any useful manner known in the art, can automatically stabilize the magnitude of filtered differentiated signal 258 to the same accuracy known for automatic gain control of the original non-differentiated signal.

Output signal 244 is analogous to output signal 144 in FIG. 5 and to output signal 44 of the pulse detector of FIG. 2, except for absence of unwanted thermal asperity transient decay components. The amplified filtered stabilized differentiated signal 258 is merely amplified by circuit 242 to create differentiated signal 244. Because the pulse detector transfer function is the same for circuit 210 of this invention as it is for circuit 110 (FIG. 5) and circuit 10 in FIG. 2, the waveform zero-crossings of output differentiated signal waveform 244 are identically positioned to those of waveforms 44 and 144. These zero-crossing positions differ only when there is a large transient change in the amplitude of input signal 22 such as a Change caused by a thermal asperity.

When a large low frequency transient occurs in pulse detector 10 of FIG. 2, the transient amplitude can saturate the high-gain AGC system (circuits 32, 34, 35 and 40) and mask all data signal pulse components until transient decay is nearly complete. In the modified circuit 210 of this invention, with proper location and values for C1, C2, R1 and R2, effects of such a transient in input signal 22 are eliminated by differentiation before the transient can be amplified sufficiently to mask signal data components through transistor saturation.

The above discussion in connection with FIG. 6 shows how the zero-crossing locations of differential signal 244 can be made essentially independent of the thermal asperity transient decay signal components. However, because input signal 22 is immediately differentiated, there is no opportunity to test each pulse found in input signal 22 to discriminate between an actual data pulse and a spurious noise pulse. Accordingly, typical pulse amplitude qualification circuits such as thresholding or delta-V circuits cannot be used with the pulse detector of this invention.

A suitable method for qualifying pulses in the pulse detector of this invention is to examine the zero-crossing slope of differentiated signal 244, which contains information about pulse amplitude. Certain pulse qualification circuits of the prior art that directly test pulse signal amplitude, such as pulse qualifier 43 (FIG. 2), accept input signal 36 directly from the output of filter 40. However, in FIG. 6, the output of filter 240 is signal 258, which is a differentiated signal, unlike signal 36 (FIG. 2) and signal 136 (FIG. 5). Because signal 244 is substantially merely an amplified version of signal 258, then both the pulse qualifying system and the zero-crossing detection system (embodied in circuit 246) can accept signal 244 directly as an input signal. This eliminates the requirement for a separate pulse qualifier circuit 43 (FIG. 2) and permits the combination of both functions in a single circuit 246, now denominated the pulse qualifier-conditioner and selector circuit 246, discussed below in connection with FIG. 9.

Figure 7:
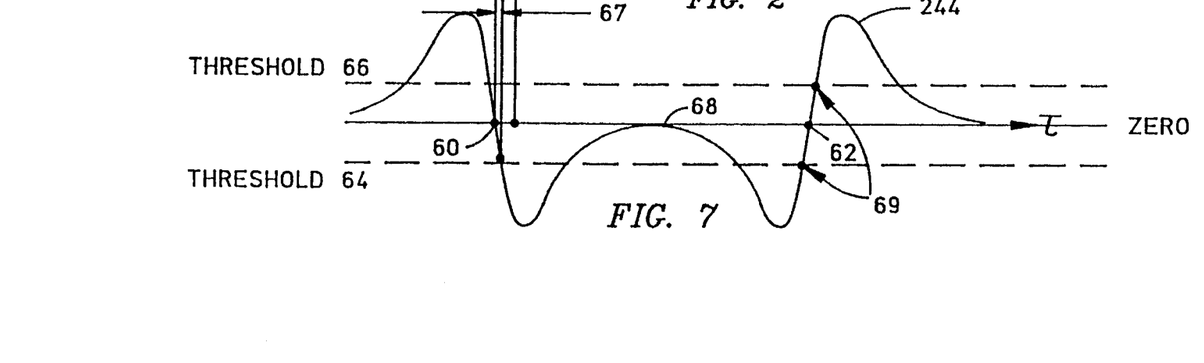
FIG. 7 illustrates the differential signal waveform on which the pulse amplitude qualification circuit of this invention operates.
Figure 9:
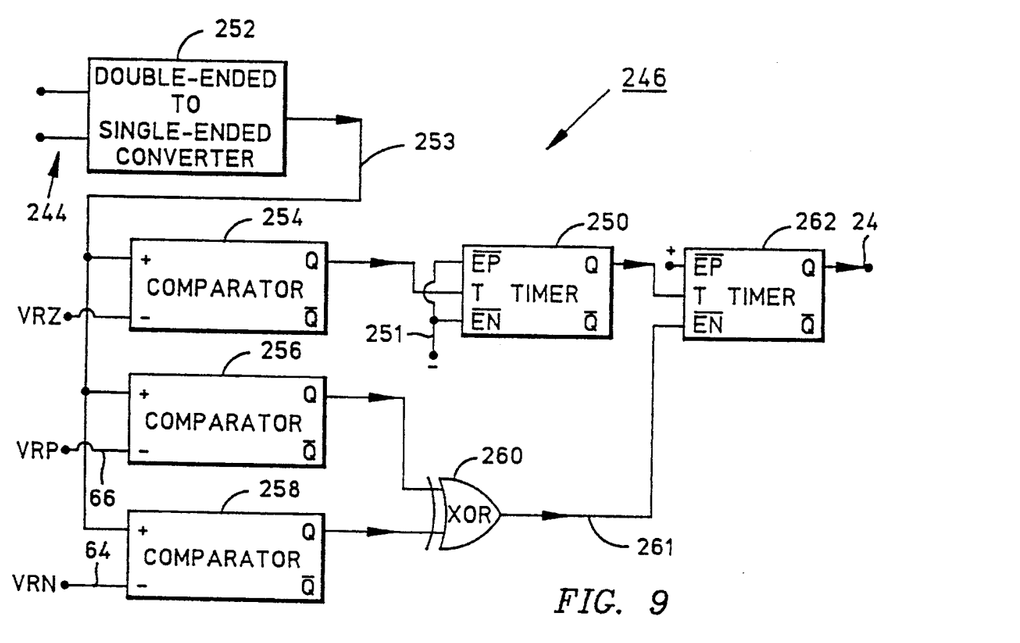
FIG. 9 is a functional block diagram of an illustrative embodiment of the modified pulse qualification, conditioning and selecting circuit of this invention.

FIG. 7 shows an exemplary waveform for differentiated signal 244 generated in response to input data pulses in signal 22. The first zero-crossing 60 has a negative slope representing a positive pulse peak and the second zero-crossing 62 has a positive slope representing a negative pulse peak. Referring to FIG. 9, in operation, the pulse qualifier, conditioner and selector circuit 246 starts a countdown timer 250 for $\delta T$ time after the zero-crossing 60 and discards the "pulse" if timer 250 expires before signal 244 exceeds a threshold 64 in the negative direction. Similarly, the same $\delta T$ timer 250 is started at zero-crossing 62 and tested for time-out until signal 244 exceeds a threshold 66. Proper selection of thresholds 64 and 66 establishes the threshold slope value and timer delay $\delta T$ against which filtered differentiated signal 244 is tested. The predetermined $\delta T$ value shown in FIG. 7 is longer than a threshold-crossing interval 67, thus qualifying the pulse represented by the slope at zero-crossing 60.

The operation of qualifier, conditioner and selector circuit 246 is similar to the delta-V detector known in the art, which requires that a signal voltage drop from a pulse peak by a specific amount within a selected required time to qualify as a valid pulse. The operation of circuit 246 in FIG. 9 requires that a predetermined change in differentiated signal 244 occur within a specified time, $\delta T$, which is equivalent to requiring the average slope of the undifferentiated pulse waveform to have a slope greater than a specified amount. Since the slope at a pulse peak is zero, then the specified curvature between the pulse peak and a later time mathematically determines the equivalent change in pulse amplitude, similarly to a delta-V test.

Qualifier, conditioner and selector circuit 246 shown in FIG. 9 is now described in more detail. The power connections are omitted for simplicity. The doubled-ended differentiated signal 244 developed on the load resistors R5 and R6 in FIG. 6 is applied to the double-ended to single-ended converter 252. The single-ended analog signal 253 is connected to the three comparators, 254, 256, and 258. Signal 253 is compared to a zero voltage reference (VRZ) in comparator 254, to a positive reference voltage 66 (VRP) in comparator 256, and to a negative reference voltage 64 (VRN) in comparator 258. Each comparator 254, 256 and 258 produces a high output level when signal 253 is more positive than the corresponding reference and a low output level when signal 253 is less than the corresponding reference.

The Exclusive-OR (XOR) gate 260 produces a low digital level when the outputs of comparators 256 and 258 are both high, or both low. When signal 253 is higher than negative reference voltage 64 but lower than positive reference voltage 66, the output of comparator 258 is high and the output of comparator 256 is low. This produces a high output signal 261 from XOR-gate 260. Thus output signal 261 from XOR-gate 260 is high as signal 253 passes through the region between positive threshold voltage 66 and negative threshold voltage 64.

The remainder of circuit 246 includes the two timers, 250 and 262. Timer 250 is the $\delta T$ timer. Timer 262 produces the appropriate output pulses 24 width. Timers 250 and 262 shown are preferably of the type produced by Motorola as the MC10198 Monostable Multivibrator. The output pulse width is controlled by an external resistor and capacitor (not shown) in a manner well-known in the art. The MC10198 is an edge triggered device with the input digital line connected to the "T" input. In addition, two enabling inputs $\overline{E_p}$ and $\overline{E_N}$ are provided. The $\overline{E_p}$ enabling input allows positive edges to trigger the timer and the enabling input allows negative edges to trigger the timer. The inverting bar indicates that $\overline{E_N}$ and $\overline{E_p}$ are enabled when low. When both $\overline{E_N}$ and $\overline{E_p}$ are held low, such as with timer 250, where both are connected to a low voltage 251, then either transition direction at the input T will trigger timer 250. Such transitions represent zero-crossings in the waveform such as shown at points 60 and 62 of FIG. 7.

Timer 262 has the $\overline{E_p}$ pin held high to prevent positive-going transitions at T from triggering timer 262. Negative-going transitions will trigger timer 262 only if XOR 260 output is low. Thus signal 253 must exit the region between positive threshold 66 and negative threshold 64 before the negative-going end of the timer 250 output pulse will trigger timer 262 to produce output pulse 24.

Qualifier, conditioner and selector circuit 246 has some advantages over the delta-V detector known in the art. Because the delta-V must be determined as a drop in voltage from peak value, it requires a voltage measurement following the pulse peak. The peak must be determined before the lower voltage level can be measured, however. This results in asymmetric delta-V detection because only the one lagging side of a pulse can be tested. However, as seen in FIG. 7, the method of this invention can test both before and after the actual zero-crossing. Previously, such dual testing was available only be delaying the waveform with a delay line, which adds circuitry and cost to the pulse detector.

Figure 10:
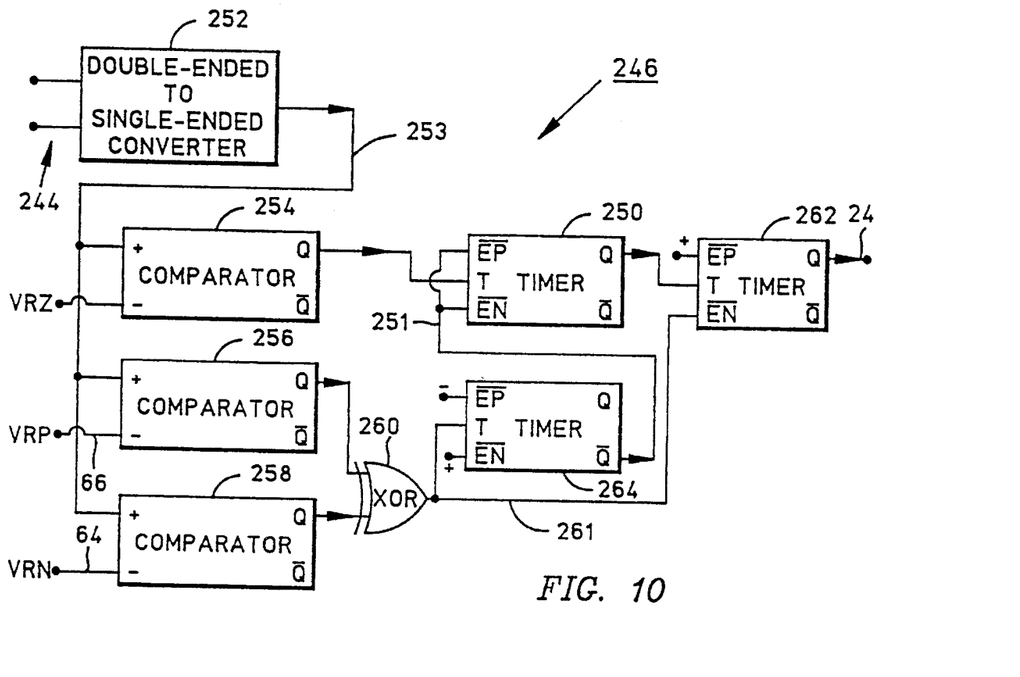
FIG. 10 is a functional block diagram of an alternative embodiment of the modified pulse qualification, conditioning and selecting circuit of this invention.

FIG. 10 shows an alternate embodiment of the qualifier, conditioner and selector circuit 246. Most of the elements of FIG. 10 are the same as shown in FIG. 9 and like reference numerals denote like elements.

FIG. 10 has an additional timer 264, and a modification of the enabling signal at line 251 to the $\overline{E_p}$ and $\overline{E_N}$ pins of timer 250. Timer 264 is set for a pulse width time of $\delta T$, which is substantially the same $\delta T$ for which timer 250 is set, although some difference may be advantageous in some eases where data pulses are not symmetric. The enabling inputs of $\overline{E_p}$ and $\overline{E_N}$ of timer 264 are connected to fixed voltages to cause the rising edge of the XOR 260 output pulse to start timer 264 when signal 253 enters the region between thresholds 64 and 66. If signal 253 is changing fast enough to cross zero before the end of the timer 264 output pulse on line 251, then timer 250 is still enabled and is triggered by the zero-crossing transition at input T. The process of testing signal 253 after the zero-crossing is the same as described above in connection with FIG. 9. Thus, for a pulse to appear in output 24, signal 253 must pass the $\delta T$ time test both before zero-crossing and after zero-crossing in FIG. 10.

It should be apparent that other useful implementations can similarly be constructed in other combinations. For instance, circuits can be designed according to this invention to qualify the signal transition time before the zero-crossing only (not shown) or the signal transition time after zero-crossing only (as in FIG. 9) or to require the transition time on both sides to qualify (as in FIG. 10). The embodiments discussed above do not include restrictions on the direction of signal transition at zero-crossing, which represents the peak polarity in the original signal. There is generally less error propagation without any such polarity restrictions, but circuits can be implemented according to this invention to require consecutive polarity reversals, for instance. Any of these combinations may be deemed advantageous in specific situations.

The method of this invention can also be used to average over the pulse peak by measuring the time interval 69 from crossing of threshold 64 to crossing threshold 66 and requiring time interval 69 to be less than a predetermined amount, such as $2\delta T$. The same time for a negative-going slope is applied for transiting between thresholds 66 and 64.

Referring to FIG. 7, note that differentiated signal 244 droops to the baseline at region 68 and then increases without reversing polarity. This exemplary event corresponds to the space between two pulses where the time rate of change is nearly zero and is the position most susceptible to errors from extra noise pulses. Any version of the qualifier, conditioner and selector circuits of this invention is useful for eliminating these errors, especially where the transition times are qualified on both sides of a zero-crossing. Even if waveform 244 is offset in the positive direction so that region 68 is above threshold 66, the extra zero-crossings are not qualified because signal 253 does not rise from the zero-crossing to a threshold-crossing quickly enough.

The circuit of this invention virtually eliminates well-known problems associated with large DC content offsets of data signal 22, such as those arising from thermal asperities in magnetoresistive hems, or from other transients. This invention is less complex than a typical peak detection system from the prior art that has no such advantages, and is much less complex and costly than previous methods for eliminating thermal asperity transients, and requires no special controls.

Clearly, other embodiments and modifications of this invention will occur readily to those of ordinary skill in the art in view of these teachings. Therefore, this invention is to be limited only the following claims, which include all such embodiments and modifications when viewed in conjunction with the above specification and accompanying drawing.

I claim:

1. A pulse detector circuit for detecting magnetoresistive sensor data pulses, said data pulses occurring at a data rate, said pulse detector comprising:

a first amplifier stage having a lower half-power gain roll-off frequency greater than 300 percent of said data rate;

a second amplifier stage coupled to the output of said first amplifier stage having a lower half-power gain roll-off frequency less than 3.0 percent of said data rate.

* * * * *